United States Patent
Lim et al.

(10) Patent No.: US 9,281,346 B1
(45) Date of Patent: Mar. 8, 2016

(54) DISPLAY DEVICE

(71) Applicant: Samsung Display Co., Ltd., Yongin (KR)

(72) Inventors: Sang Urn Lim, Suwon-si (KR); Jong Hwan Kim, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/689,673

(22) Filed: Apr. 17, 2015

(30) Foreign Application Priority Data

Jan. 7, 2015  (KR) .................. 10-2015-0001887

(51) Int. Cl.
  *H01L 27/32* (2006.01)
  *H01L 51/52* (2006.01)

(52) U.S. Cl.
  CPC ........ *H01L 27/3223* (2013.01); *H01L 27/3253* (2013.01); *H01L 27/3276* (2013.01); *H01L 51/5253* (2013.01)

(58) Field of Classification Search
  CPC ............ H01L 27/3276; H01L 27/3223; H01L 51/5253; H01L 51/524
  USPC ........................................................ 257/737
  See application file for complete search history.

(56) References Cited

U.S. PATENT DOCUMENTS

| | | | | |
|---|---|---|---|---|
| 2004/0014251 A1* | 1/2004 | Park | .................... | H01L 27/3246 438/22 |
| 2007/0052119 A1* | 3/2007 | Sakai | ................ | G02F 1/133516 264/1.7 |
| 2007/0290196 A1* | 12/2007 | Fischer | ............... | H01L 27/3253 257/40 |
| 2008/0136337 A1* | 6/2008 | Rogojevic | ............. | H01L 25/048 315/169.3 |
| 2008/0284690 A1* | 11/2008 | Ko | ........................ | H01L 27/3211 345/76 |
| 2008/0291349 A1* | 11/2008 | Kim | .................... | G02F 1/13458 349/46 |
| 2012/0301987 A1* | 11/2012 | Pang | ................... | H01L 27/3246 438/34 |
| 2014/0029226 A1 | 1/2014 | Abe et al. | | |
| 2014/0367707 A1* | 12/2014 | Meng | .................. | H01L 27/3253 257/88 |

FOREIGN PATENT DOCUMENTS

| | | |
|---|---|---|
| JP | 2009-192796 | 8/2009 |
| JP | 2012-227480 | 11/2012 |
| JP | 2014-026042 | 2/2014 |
| KR | 10-2009-0090762 | 8/2009 |

\* cited by examiner

*Primary Examiner* — Nathan Ha
(74) *Attorney, Agent, or Firm* — H.C. Park & Associates, PLC

(57) ABSTRACT

A display device includes an array substrate including a display area and a non-display area, a driving circuit chip disposed on the non-display area and including a bottom surface, a top surface, a first pair of side surfaces extending in a first direction, and a second pair of side surfaces extending in a second direction perpendicular to the first direction, and first, second, and dummy bumps, each disposed on the bottom surface in a single column along the first direction, in which the dummy bumps include first and second dummy bump groups disposed between the first and second bumps along the first direction, the dummy bumps in the first dummy bump group are spaced apart from each other by a first pitch, and the dummy bumps in the second dummy bump group are spaced apart from each other by a second pitch different from the first pitch.

20 Claims, 12 Drawing Sheets

2

DISPLAY DEVICE

CROSS-REFERENCE TO RELATED APPLICATION

This application claims priority from and the benefit of Korean Patent Application No. 10-2015-0001887, filed on Jan. 7, 2015, which is hereby incorporated by reference for all purposes as if fully set forth herein.

BACKGROUND

1. Field

Exemplary embodiments of the present invention relate to a display device. More particularly, the exemplary embodiments of the present invention relate to a display device including bumps therein.

2. Discussion of the Background

The importance of display devices has steadily grown with developments in multimedia technology. As a result, various display devices such as a liquid crystal display (LCD) device, an organic light-emitting diode (OLED) display device, and the like have been developed.

A display device such as an LCD device or an OLED display device may include an array substrate, which has a display area and a non-display area disposed outside the display area. The array substrate may be used as a circuit board for independently driving each pixel in the LCD device or the OLED display device. Gate lines transmitting a scan signal, data lines transmitting an image signal, thin-film transistors (TFTs), and various organic or inorganic insulating layers may be disposed on the array substrate. Each of the TFTs may include a semiconductor layer forming a channel with part of each of the gate lines, i.e., a gate electrode, and source, and drain electrodes, which are parts of each of the data lines, and serve as a switching device.

In the non-display area disposed outside the display area, lines connected to the gate lines or the data lines in the display area may be disposed. The lines may extend in various directions and be connected to pads provided in a pad unit below the array substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display device that may prevent warpage that occurs during mounting a driving circuit chip on a substrate or contact failure that may occur at either side of the driving circuit chip.

Additional aspects will be set forth in the detailed description which follows, and, in part, will be apparent from the disclosure, or may be learned by practice of the inventive concept.

According to an exemplary embodiment of the present invention, a display device includes an array substrate including a display area and a non-display area, a driving circuit chip disposed on the non-display area, the driving circuit chip including a bottom surface providing a mounting surface, a top surface facing the bottom surface, a first pair of side surfaces extending in a first direction, and a second pair of side surfaces extending in a second direction perpendicular to the first direction, and first bumps, second bumps, and dummy bumps, each of the first, second, and dummy bumps disposed on the bottom surface of the driving circuit chip in a single column along the first direction, in which the dummy bumps include first and second dummy bump groups disposed between the first bumps and the second bumps along the first direction, the dummy bumps in the first dummy bump group are spaced apart from each other by a first pitch, and the dummy bumps in the second dummy bump group are spaced apart from each other by a second pitch different from the first pitch.

A number of the dummy bumps in the second dummy bump group may be less than a number of dummy bumps in the first dummy bump group.

The second pitch may be greater than the first pitch.

A first distance from a first side of the dummy bumps facing the first bumps to the first bumps may be substantially the same to a second distance from a second side of the dummy bumps facing the second bumps to the second bumps.

The width of the dummy bumps may be substantially the same to the second width of the first bumps and the second bumps.

The length of the dummy bumps may be substantially the same to the second length of the first bumps and the second bumps.

The driving circuit chip may be disposed on the non-display area in a chip-on-glass (COG) structure.

The display device may further include first pads and second pads disposed on the non-display area in columns along the first direction, in which wherein the first and second pads correspond to the first and second bumps, respectively.

The driving circuit chip may include a length extension extending along a first side of the driving circuit chip in the second direction, and the length of the length extension in the second direction may be greater than the length of the first bumps.

According to an exemplary embodiment of the present invention, a display device includes an array substrate including a display area and a non-display area, a driving circuit chip disposed on the non-display area, the driving chip including a bottom surface providing a mounting surface, a top surface facing the bottom surface, a first pair of side surfaces extending in a first direction, and a second pair of side surfaces extending in a second direction perpendicular to the first direction, first bumps disposed on the bottom surface of the driving circuit chip in at least two separate columns along the first direction, second bumps disposed on the bottom surface of the driving circuit chip in a single column along the first direction, the second bumps spaced apart from the first bumps in the second direction, and dummy bumps disposed between the first and second bumps in at least two separate columns, in which the dummy bumps include a first dummy bump group and a second dummy bump group, the first and second dummy bump groups respectively disposed on first and second sides of the driving circuit chip along the first direction, the first side being opposite to the second side, the dummy bumps in the first dummy bump group are spaced apart from each other by a first pitch, and the dummy bumps in the second dummy bump group are spaced apart from each other by a second pitch different from the first pitch.

The second pitch may be greater than the first pitch.

The dummy bumps may have substantially the same shape as the first bumps and the second bumps.

The display device may further include first pads disposed on the non-display area along the first direction to correspond to the first bumps, and second pads disposed on the non-display area along the first direction to correspond to the second bumps, in which the first and second bumps are electrically connected to the first and second pads by an anisotropic conductive film, respectively.

The driving circuit chip may include a length extension extending along a first side of the driving circuit chip along the second direction, and the length of the length extension in the second direction may be greater than the length of the first bumps.

According to an exemplary embodiment of the preset invention, a display device includes a driving circuit chip including a bottom surface providing a mounting surface, a top surface facing the bottom surface, a first pair of side surfaces extending in a first direction, and a second pair of side surfaces extending in a second direction perpendicular to the first direction, an array substrate comprising a display area and a non-display area, the display area including an array element, the non-display area including first pads and second pads respectively disposed on a first side and a second side of the non-display area in a single column along the first direction, the first side being opposite to the second side, first and second bumps disposed on first and second sides of the bottom surface of the driving circuit chip in a single column along the first direction to correspond to the first and second pads, respectively, and dummy bumps disposed between the first bumps and the second bumps in at least one column along the first direction, in which the dummy bumps include a first dummy bump group including the dummy bumps spaced apart from each other by a first pitch, and a second dummy bump group including the dummy bumps spaced apart from each other by a second pitch different from the first pitch.

The driving circuit chip may further include a length extension extending along a first side of the driving circuit chip in the second direction, and the first bumps and the second bumps may not be arranged below the length extension.

The length of the length extension along the second direction may be proportional to at least one of a number of columns of the first bumps, a distance from the first bumps to the second bumps, and compression load applied to the driving circuit chip.

The length of the length extension along the second direction may be inversely proportional to at least one of a thickness of the driving circuit chip and a thickness of the array substrate.

The dummy bumps may be disposed in the middle portion of the bottom surface of the driving circuit chip.

The dummy bumps may have substantially the same thickness as the first bumps and the second bumps.

According to the exemplary embodiments of present invention, it may be possible to prevent warpage that may occur during mounting a driving circuit chip on a substrate. In addition, contact failure that may occur at either side of the driving circuit chip may be prevented. Therefore, it may be possible to reduce the rate of defects during mounting a driving circuit chip on a substrate and improve reliability.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
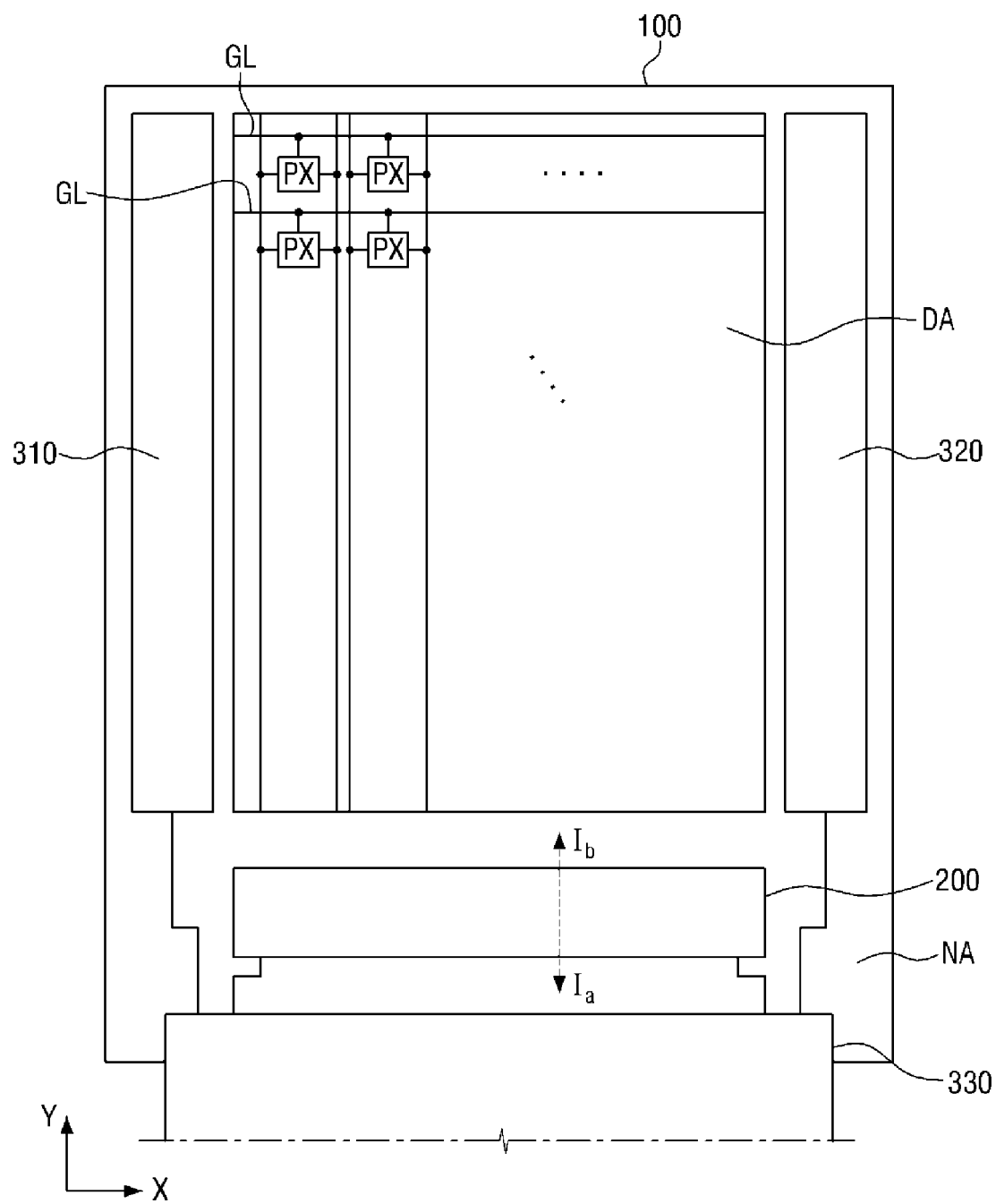
FIG. 1 is a plan view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view of a display device according to an exemplary embodiment of the present invention.

Referring to FIG. 1, the display device according to an exemplary embodiment of the present invention may include an array substrate 100 and a driving circuit chip 200.

The array substrate 100 may include a material with high transmissivity, heat resistance, and chemical resistance. The array substrate 100 may include one of glass, polyethylene naphthalate, polyethylene terephthalate, and polyacryl, which are materials with high optical transmissivity. The array substrate 100 may include a display area DA and a non-display area NA.

The display area DA may be a region where an image is displayed. The display area DA may include pixel units PX arranged in a matrix form. Each of the pixel units PX may include a display element, which displays an image, and a thin-film transistor (TFT), which is electrically connected to the display element. The display element may be an organic light-emitting diode (OLED). The pixel units PX may be defined by gate lines GL and data lines DL that intersect the gate lines GL. The gate lines GL may extend in a first direction X, and the data lines DL may extend in a second direction Y intersecting the first direction X. The gate lines GL and the data lines DL may be disposed on the array substrate 100 while being insulated from each other. The first direction X may correspond to a row direction of the pixel units PX, and the second direction Y may correspond to a column direction of the pixel units PX.

The non-display area NA may be a region where no image is displayed and surround the display area DA. The non-display area NA may be provided along or near the edges of the display panel 100. In the non-display area NA, the driving circuit chip 200, a gate driving unit 310, a power supply unit 320, and a flexible printed circuit board (FPCB) 330 may be provided.

The driving circuit chip 200 may include a bottom surface, which is provided as a mounting surface, a top surface, which faces the bottom surface, a pair of side surfaces, which extend in the first direction X, and a pair of side surfaces, which extend in the second direction Y. The bottom surface of the driving circuit chip 200 may be a surface on which the driving circuit chip 200 may be mounted on the array substrate 100. The terms "bottom surface" and "mounting surface" will hereinafter be used interchangeably. The first direction X may be a direction of the long sides of the driving circuit chip 200, i.e., a longitudinal direction of the driving circuit chip 200. The second direction Y may be a direction of the short sides of the driving circuit chip 200, i.e., a latitudinal direction of the driving circuit chip 200. The driving circuit chip 200 may be mounted on the array substrate 100 in a chip-on-glass (COG) method. More specifically, the driving circuit chip 200 may be mounted on the array substrate 100 by arranging an anisotropic conductive film (ACF) between the driving circuit chip 200 and the array substrate 100, and thermally compressing the ACF at high temperature. The mounting of the driving circuit chip 200 on the array substrate 100 will be described later in detail with reference to FIGS. 11 and 12. The driving circuit chip 200 may be a source driver integrated circuit (IC) providing a data signal to each of the data lines DL. Alternatively, the driving circuit chip 200 may be a combined driver IC, which the source driver IC and a scan driver IC providing a scan signal to each of the gate lines GL are integrated. In the description that follows, it is assumed that an additional IC, i.e., the gate driving unit 310, is arranged to provide a scan signal to each of the gate lines GL. According to an exemplary embodiment of the present invention, more than one driving circuit chip 200 may be provided.

The gate driving unit 310 may be arranged along a side of the display panel 100, perpendicular to the side of the display panel 100 where the driving circuit chip 200 is arranged. The gate driving unit 310 may provide a scan signal to each of the gate lines GL and sequentially scan the pixel units PX.

The power supply unit 320 may be arranged along a side of the display panel 100, perpendicular to the side of the display panel 100 where the driving circuit chip 200 is arranged. The power supply unit 320 may provide power voltage for driving each of the pixel units PX. The FPCB 330 may transmit one or more signals for driving the array substrate 100 to the driving circuit chip 200.

Figure 2:
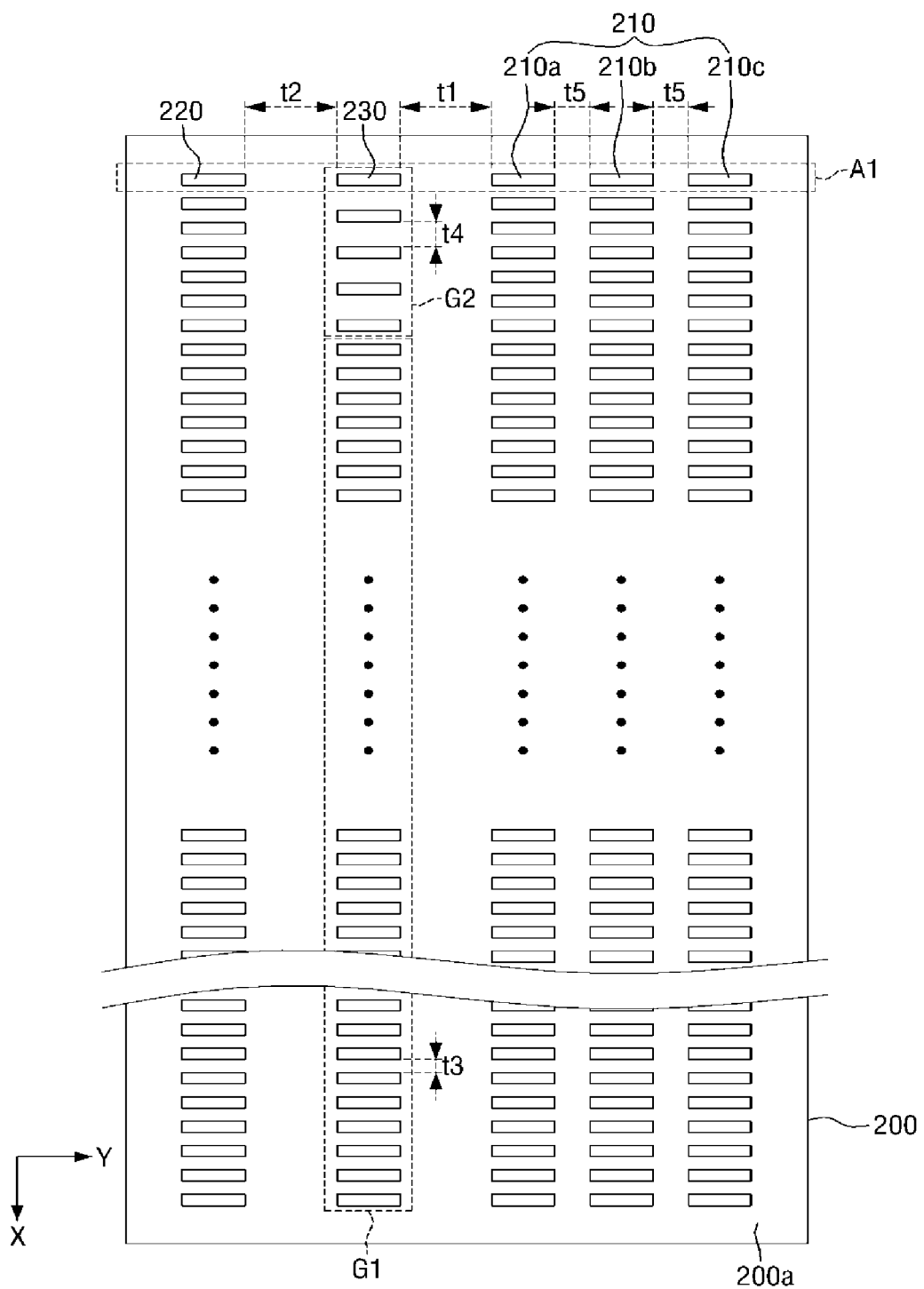
FIG. 2 is a plan view illustrating a mounting surface of a driving circuit chip illustrated in FIG. 2.
Figure 3:
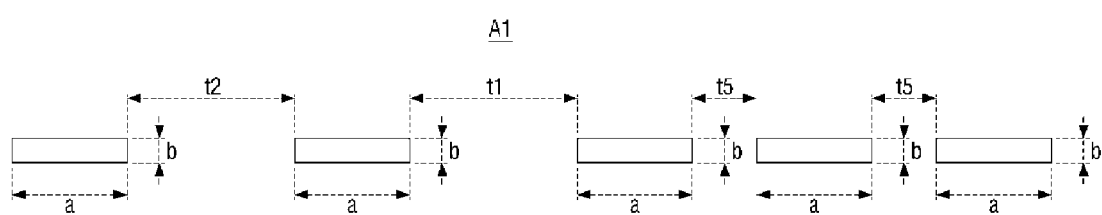
FIG. 3 is a detailed plan view illustrating area A1 of FIG. 2.

FIG. 2 is a plan view illustrating a mounting surface of the driving circuit chip 200. FIG. 3 is a detailed plan view illustrating area A1 of FIG. 2.

Referring to FIGS. 2 and 3, the display device of FIG. 1 may also include first bumps 210, second bumps 220, and dummy bumps 230. The first bumps 210, the second bumps 220, and the dummy bumps 230 may be disposed on the same surface of the driving circuit chip 200, for example, a bottom surface 200a. The numbers and shapes of the first bumps 210, the second bumps 220, and the dummy bumps 230 may vary according to a resolution of the display device.

The first bumps 210 may be disposed on a first side of the bottom surface 200a of the driving circuit chip 200 with respect to the second direction Y. The first bumps 210 may be spaced apart from one another in the first direction X. The first bumps 210 may be arranged in, for example, three columns. More particularly, the first bumps 210 may include three columns of first bumps 210 that perform substantially the same functions. The three columns of first bumps 210 may include a first column of first bumps 210a, a second column of first bumps 210b, and a third column of first bumps 210c, which are arranged on the bottom surface 200a of the driving circuit chip 200 along the first direction X. The first column of first bumps 210a, the second column of first bumps 210b, and the third column of first bumps 210c may be formed in substantially the same shape, and may be spaced apart from one another by a predetermined distance t5. The distance t5 may be 100 μm or less. The first bumps 210 may be formed of a conductive material such as gold (Au), copper (Cu) or nickel (Ni). The first bumps 210 may be output bumps providing a signal to the display area DA of the array substrate 100.

The second bumps 220 may be disposed on a second side of the bottom surface 200a of the driving circuit chip 200 with respect to the second direction Y. The second bumps 220 may be spaced apart from one another in the first direction X. The second bumps 220 may be input bumps receiving a signal via the FPCB 330. The second bumps 220 may have substantially the same shape as the first bumps 210, and may be formed of the same material as the first bumps 210. The driving circuit chip 200 may receive a power supply voltage, a ground voltage, or a data signal from the FPCB 330 via the second bumps 220. Therefore, the second bumps 220 may be electrically connected to the FPCB 330.

The dummy bumps 230 may be arranged in a single column on the bottom surface 200a of the driving circuit chip 200 between the first bumps 210 and the second bumps 220, and may be spaced apart from one another in the first direction X. A distance t1 between the first bumps 210 and the dummy bumps 230 may be substantially the same to a distance t2 between the dummy bumps 230 and the second bumps 220. More particularly, the dummy bumps 230 may be disposed in the middle of the first bumps 210 and the second bumps 220. The dummy bumps 230 may be formed of an insulating material, for example, a silicon insulating material. The dummy bumps 230 may include a first dummy bump group G1 and a second dummy bump group G2. A pitch t3 between the dummy bumps 230 in the first dummy bump group G1 may be different from a pitch t4 between the dummy bumps 230 in the second dummy bump group G2. More specifically, the pitch t3 may be smaller than the pitch t4. Accordingly, the freedom of the design of wiring in the second dummy bump group G2 may be improved. The pitch t3 and the pitch t4 may have a predetermined ratio therebetween, for example, a ratio of 1:1.5. The number of dummy bumps 230 included in the first dummy bump group G1 may be greater than the number of dummy bumps 230 included in the second dummy bump group G2.

Referring to FIG. 3, the dummy bumps 230 may have substantially the same shape as the first bumps 210 and the second bumps 220. More specifically, the first bumps 210, the second bumps 220, and the dummy bumps 230 may have substantially the same length, i.e., a length a, substantially the same width, i.e., a width b, and substantially the same thickness, i.e., a thickness c. Alternatively, the length, width, and thickness of the first bumps 210, the second bumps 220, and the dummy bumps 230 may vary according to the length of the array substrate 100 or the driving circuit chip 200.

Figure 4:
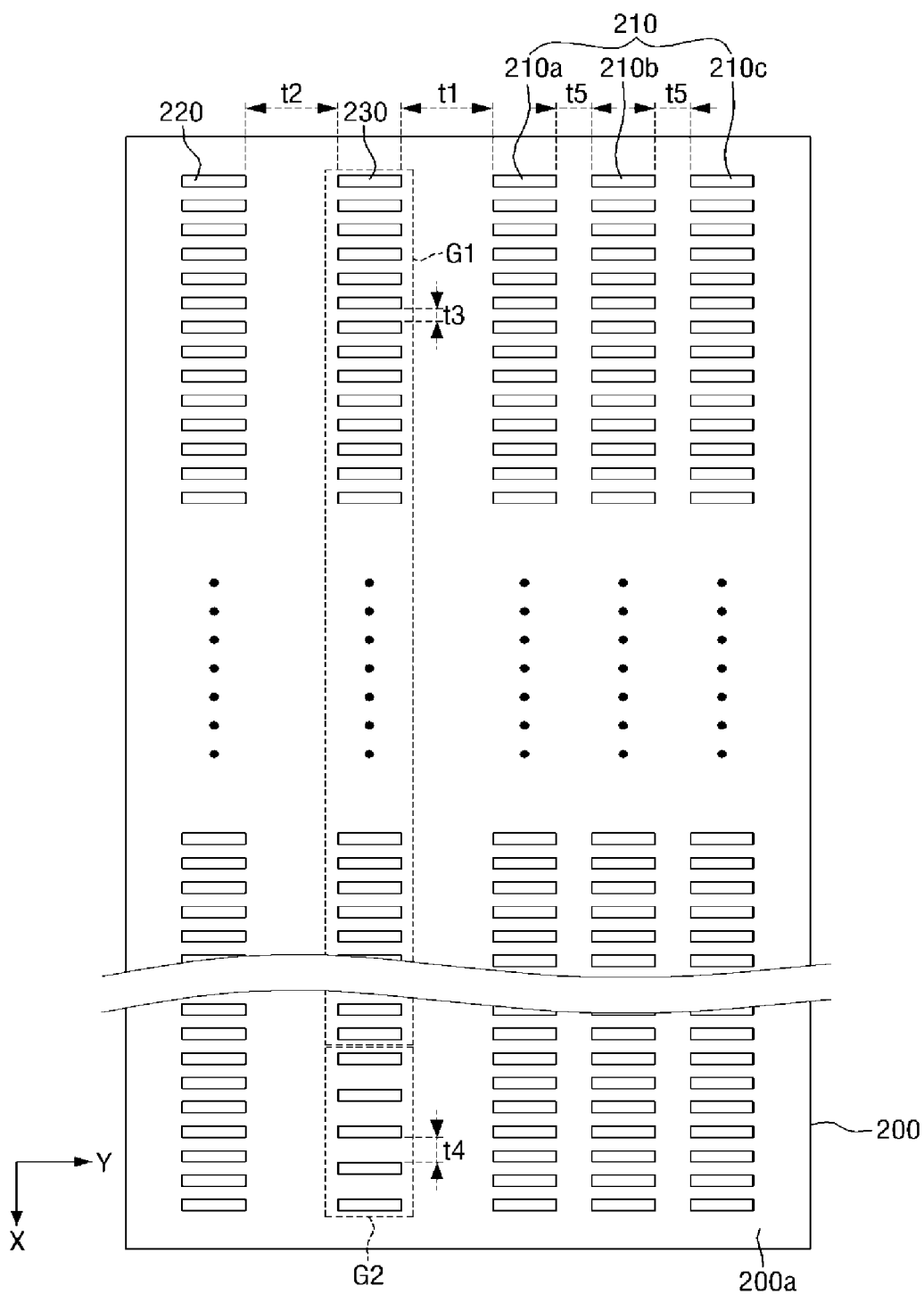
FIG. 4 is a plan view illustrating a mounting surface of the driving circuit chip illustrated in FIG. 1, according to an exemplary embodiment of the present invention.
Figure 5:
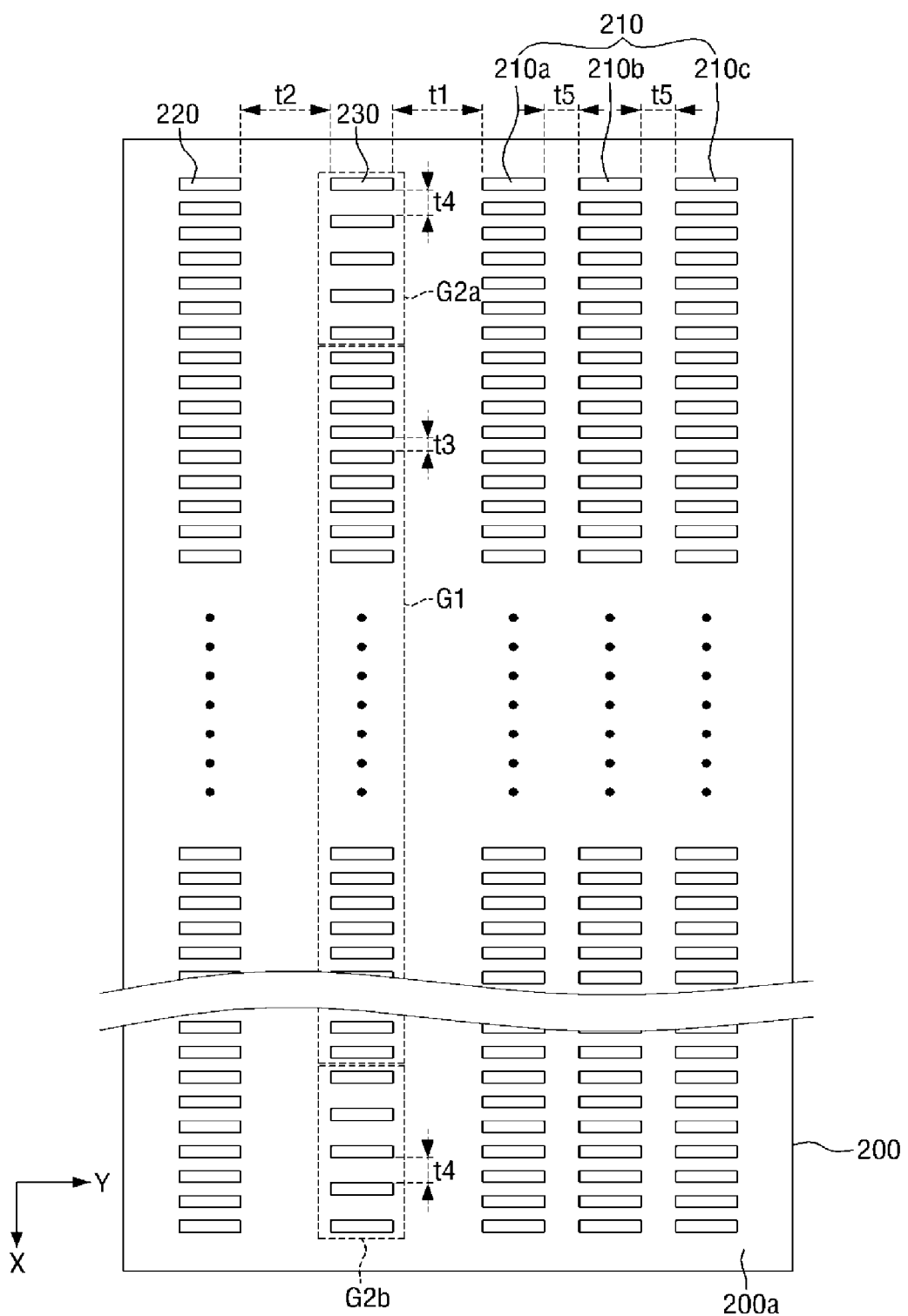
FIG. 5 is a plan view illustrating a mounting surface of the driving circuit chip illustrated in FIG. 1, according to an exemplary embodiment of the present invention.

FIG. 4 is a plan view illustrating a mounting surface of the driving circuit chip 200 according to an exemplary embodiment of the present invention. FIG. 5 is a plan view illustrating a mounting surface 200a of the driving circuit chip 200 according to an exemplary embodiment of the present invention.

Referring to FIG. 4, a first dummy bump group G1 may be disposed at an upper part of the bottom surface 200a of the driving circuit chip 200. Accordingly, a second dummy bump group G2 may be disposed at a lower part of the bottom surface 200a of the driving circuit chip 200. Referring to FIG. 5, dummy bumps 230 may include a first dummy bump group G1 including dummy bumps 230 arranged at a pitch t3 and two second dummy bump groups G2a and G2b each including dummy bumps 230 arranged at a pitch t4. According to an exemplary embodiment illustrated with reference to FIG. 5, the second dummy bump groups G2a and G2b may be disposed on either side of the first dummy group G1 with respect to the first direction X. Alternatively, the locations of the first and second dummy bump groups G1 and G2 may vary to increase the freedom of the design of wiring. Also, as illustrated in FIG. 5, two second dummy bump groups, i.e., the second dummy bump groups G2a and G2b, may be provided on either side of the first dummy bump group G1 with respect to the first direction X.

Figure 6:
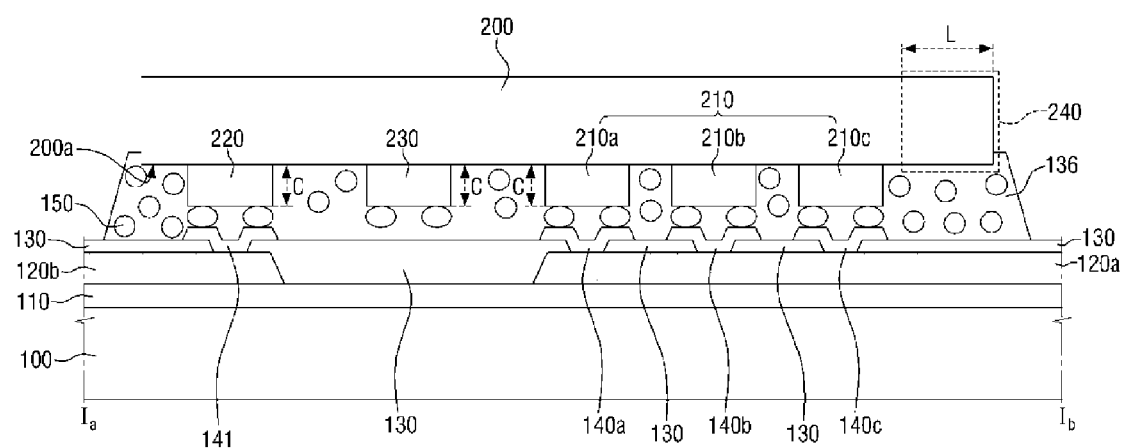
FIG. 6 is a cross-sectional view of the display device according to the embodiment of FIG. 1, taken along line $I_a$-$I_b$ of FIG. 1.

FIG. 6 is a cross-sectional view of the display device of FIG. 1, taken along line $I_a$-$I_b$ of FIG. 1.

Referring to FIGS. 1 and 6, the display device of FIG. 1 may include first pads 120a and second pads 120b. The first pads 120a may be formed on the array substrate 100 to correspond to the first bumps 210, respectively, and the second pads 120b may also be formed on the array substrate 100 to correspond to the second bumps 220, respectively.

More specifically, referring to FIG. 6, a first pad 120a and a second pad 120b may be formed on a first insulating layer 110 disposed on the array substrate 100. The first insulating layer 110 may include a single layer or multiple layers. The first pad 120a disposed at a location corresponding to a first bump 210 may be an output pad, and connected to one of the data lines DL of FIG. 1. The second pad 120a disposed at a location corresponding to a second bump 220 may be an input pad, and connected to the FPCB 330 of FIG. 1. More particularly, the first pad 120a and the second pad 120b may be arranged on the array substrate 100 along the second direction Y, and the first pad 120a may be connected to the first bump 210, which includes three columns of first bumps 210a, 210b, and 210c. A second insulating layer 130 may be formed on the first pad 120a and the second pad 120b to partially expose the first pad 120a and the second pad 120b. The first pad 120a may be connected to three first data electrodes 140a, 140b, and 140c via three contact holes, respectively. The second pad 120b may be connected to a second data electrode 141 via a single contact hole.

An anisotropic conductive film 136 may include conductive balls 150, and may be formed on the first data electrodes 140a, 140b, and 140c and the second data electrode 141 to cover the first data electrodes 140a, 140b, and 140c and the second data electrode 141. The conductive balls 150 may have a circular shape with a diameter of about 3 to 4 μm, and a portion of the conductive balls 150 may be transformed into an elliptical shape during a chip-on-glass (COG) process. A pressure may be applied to the conductive balls 150 during the COG process to transform the conductive balls 150, and the transformation of the conductive balls 150 may electrically connect the first bump 210 and the second bump 220 to the first pad 120a and the second pad 120b, respectively. Accordingly, a signal from the first pad 120a may be provided to the first bump 210 via conductive balls 150 that are electrically connected to the first pad 120a. Also, a signal from the second pad 120b may be provided to the second bump 220 via conductive balls 150 that are electrically connected to the second pad 120b.

A dummy bump 230 may be disposed in the middle of the first bump 210 and the second bump 220. A thickness c of the dummy bump 230 may be substantially the same to a thickness c of the first bump 210 and the second bump 220. The dummy bump 230 may be formed in various shapes, other than that illustrated in FIG. 6, such as a circular, elliptical or polygonal shape. For the dummy bump 230, unlike for the first bump 210 and the second bump 220, no pad may be provided on the array substrate 100 that corresponds to the dummy bump 230.

Conventionally, since no bumps are provided between the first bumps 210 and the second bumps 220 on the bottom surface 200a of the driving circuit chip 200, thermally compressing the driving circuit chip 200 may generate warpage. A display device according to an exemplary embodiment of the present invention may include the dummy bumps 230 disposed in the middle of the first bumps 210 and the second bumps 220, to prevent generation of warpage during the thermal compression of the driving circuit chip 200. Accordingly, contact failures that may occur in the driving circuit chip 200 may be minimized.

The driving circuit chip 200 may include a length extension 240. The length extension 240 may be formed on one side of the driving circuit chip 200 with respect to the second direction Y, i.e., a longitude direction of the driving circuit chip 200. The length extension 240 may be disposed on one of the two sides of the driving circuit chip 200 with respect to the longitude direction of the driving circuit chip 240, where the first bumps 210 are disposed. No bumps may be disposed below the length extension 240, and a length L of the length extension 240 may be greater than the length a of the first bumps 210. More specifically, the length L of the length extension 240 may be proportional to at least one of the number of columns of first bumps 210, the distance between the first bumps 210 and the second bumps 220, and the compression load (Mpa) to be applied to the driving circuit chip during thermal compression. In addition, the length L of the length extension 240 may be inversely proportional to at least one of the thickness of the driving circuit chip 200 and the thickness of the array substrate 100. The length of the length extension 240 may be expressed as the following equation.

$$L \geq 0.1 * \frac{\text{Number of Columns of First Bumps } (ea) * W * \text{Compression Load } (Mpa)}{\text{Thickness of Driving Circuit Chip} + \text{Thickness of Array Substrate}} \quad [\text{Equation 1}]$$

W denotes a distance between the first bumps 210 and the second bumps 220. Conventionally, the driving circuit chip 200 may be bent between the first bumps 210 and the second bumps 220 during thermal compression, and as a result, a contact failure may occur between the first bumps 210c and the driving circuit chip 200. However, in the display device according to an exemplary embodiment of the present invention, the length extension 240 of the driving circuit chip 200 may prevent contact failure from occurring between the first bumps 210c and the driving circuit chip 200.

Figure 7:
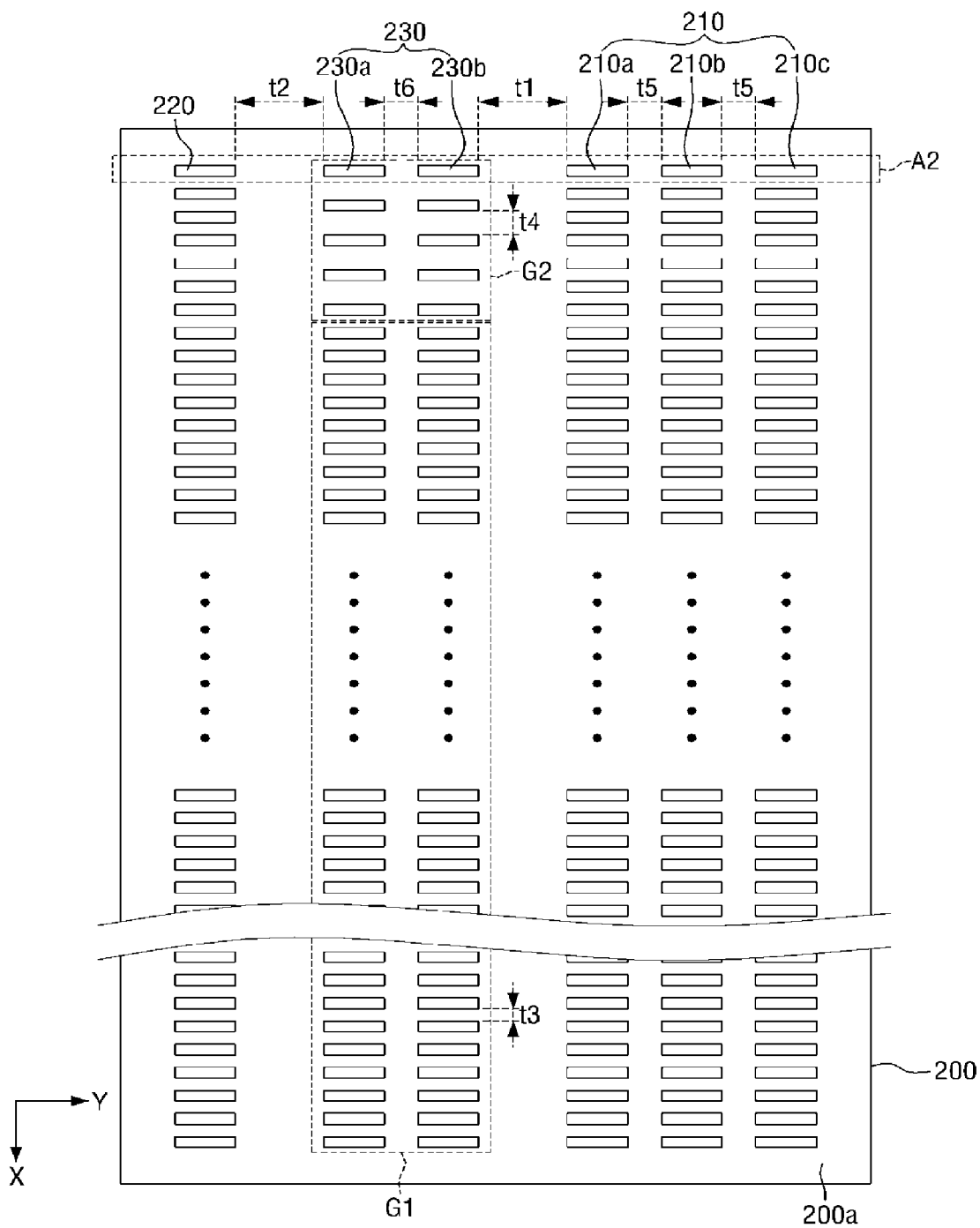
FIG. 7 is a plan view illustrating a mounting surface of the driving circuit chip illustrated in FIG. 1, according to an exemplary embodiment of the present invention.
Figure 8:
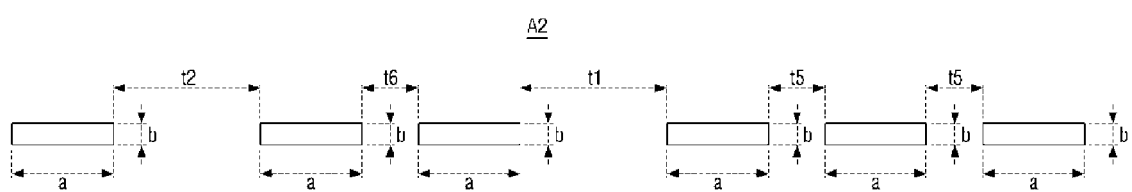
FIG. 8 is a detailed plan view illustrating area A2 of FIG. 7.

FIG. 7 is a plan view illustrating a mounting surface of the driving circuit chip 200 according to an exemplary embodiment of the present invention. FIG. 8 is a detailed plan view illustrating area A2 of FIG. 7. An exemplary embodiment of the present invention illustrated in FIG. 7 will hereinafter be described, focusing mainly on differences with the mounting surface illustrated with reference to FIG. 2.

Referring to FIGS. 7 and 8, dummy bumps 230 may be arranged on the bottom surface 200a of the driving circuit chip 200 between first bumps 210 and second bumps 220 in two separate columns in the first direction X. More particularly, the dummy bumps 230 may include two separate columns of dummy bumps 230, i.e., a column of first sub-dummy bumps 230a and a column of second sub-dummy bumps 230b. The first sub-dummy bumps 230a and the second sub-dummy bumps 230b may be spaced apart from each other by a predetermined distance t6. For example, the distance t6 may be less than 100 μm. A distance t2 between the first sub-dummy bumps 230a and second bumps 220 may be substantially the same to a distance t1 between the second sub-dummy bumps 230b and the first bumps 210. More particularly, the first sub-dummy bumps 230a and the second sub-dummy bumps 230b may be disposed in the middle of the first bumps 210 and the second bumps 220. The first sub-dummy bumps 230a and the second sub-dummy bumps 230b may be formed of the same material, for example, a silicon insulating material, and may have substantially the same shape. The first sub-dummy bumps 230a and the second sub-dummy bumps 230b may have substantially the same shape as the first bumps 210 and the second bumps 220. More specifically, the first sub-dummy bumps 230a, the second sub-dummy bumps 230b, the first bumps 210, and the second bumps 220 may have substantially the same length, i.e., a length a, substantially and the same width, i.e., a width b, and substantially the same thickness, i.e., a thickness c. Alternatively, width and thickness of the first sub-dummy bumps 230a, the second sub-dummy bumps 230b, the first bumps 210, and the second bumps 220 may vary according to the length of the array substrate 100 or the driving circuit chip 200.

The dummy bumps 230 may include a first dummy bump group G1 and a second dummy bump group G2. A pitch t3 between the dummy bumps 230 in the first dummy bump group G1 may be different from a pitch t4 between the dummy bumps 230 in the second dummy bump group G2. More specifically, the pitch t3 may be smaller than the pitch t4. Accordingly, the freedom of the design of wiring in the second dummy bump group G2 may be improved. The pitch t3 and the pitch t4 may have a predetermined ratio therebetween, for example, a ratio of 1:2. The number of dummy bumps 230 included in the first dummy bump group G1 may be greater than the number of dummy bumps 230 included in the second dummy bump group G2. The first and second dummy bump groups G1 and G2 may be located as illustrated in FIG. 8, or as illustrated in FIG. 4. Also, as illustrated in FIG. 5, two second dummy bump groups, i.e., second dummy bump groups G2a and G2b, may be provided on either side of the first dummy bump group G1 with respect to the first direction X.

Figure 9:
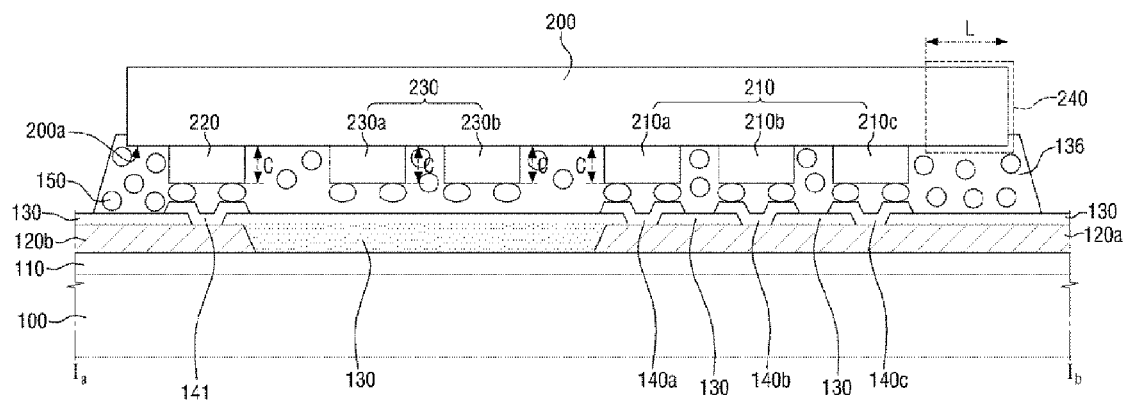
FIG. 9 is a cross-sectional view of a display device according to an exemplary embodiment of the present invention, taken along line $I_a$-$I_b$ of FIG. 1.

FIG. 9 is a cross-sectional view of a display device according to an exemplary embodiment of the present invention, taken along line $I_a$-$I_b$ of FIG. 1.

Referring to FIGS. 1, 7, and 9, the display device according to an exemplary embodiment of the present invention may include first pads 120a and second pads 120b. The first pads 120a may be formed on an array substrate 100 to correspond to the first bumps 210, respectively, and the second pads 120b may be formed on the array substrate 100 to correspond to the second bumps 220, respectively. No pads may be formed at locations where the first sub-dummy bumps 230a and the second sub-dummy bumps 230b are formed.

More specifically, referring to FIG. 9, a dummy bump 230 may be disposed between a first bump 210 and a second bump 220. A thickness c of the dummy bump 230 may be substantially the same to a thickness c of the first bump 210 and the second bump 220. The dummy bump 230 may be formed in various shapes, other than that illustrated in FIG. 9, such as a circular, elliptical, or polygonal shape. For the dummy bump 230, unlike for the first bump 210 and the second bump 220, no pad may be provided on the array substrate 100 at a location corresponding to the dummy bump 230. According to an exemplary embodiment of the present invention, in the display device of FIG. 9, since the dummy bumps 230 are arranged on the array substrate 100 where no pads are provided, implementing the thermal compression of a driving circuit chip 200 may prevent generation of warpage, and as a result, contact failures that may occur in the driving circuit chip 200 may be minimized.

The driving circuit chip 200 may also include a length extension 240. A length L of the length extension 240 may be proportional to at least one of the number of columns of first bumps 210, the distance between the first bumps 210 and the second bumps 220, and the compression load (Mpa) to be applied to the driving circuit chip during thermal compression. Also, the length L of the length extension 240 may be inversely proportional to at least one of the thickness of the driving circuit chip 200 and the thickness of the array substrate 100. Since the driving device of FIG. 9 includes the length extension 240, contact failures that may occur between first bumps 210c and the driving circuit chip 200 may be prevented.

Figure 10:
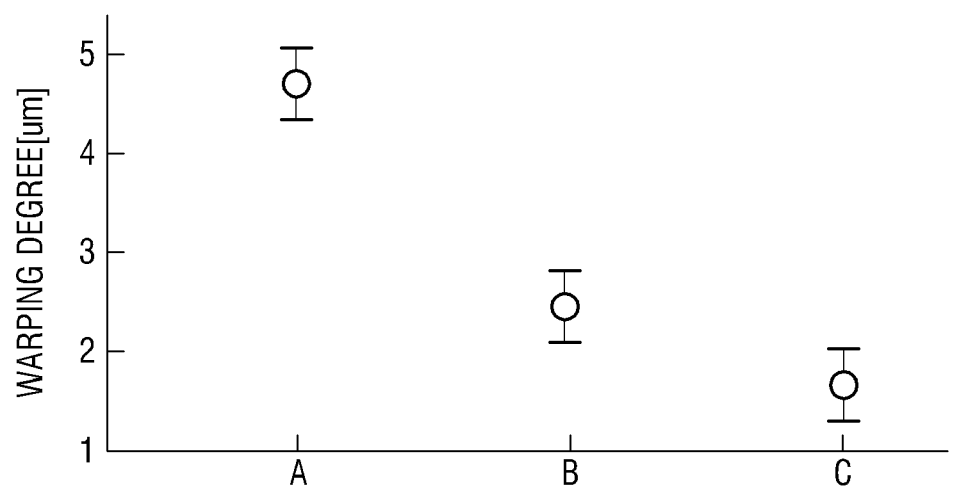
FIG. 10 is a graph illustrating warping degrees of display devices according to an exemplary embodiment of the present invention.

FIG. 10 is a graph illustrating warping degrees of display devices according to the exemplary embodiments of the invention. In FIG. 10, reference character A denotes a related-art display device, reference character B denotes a display device according to an exemplary embodiment of the present invention including the dummy bumps 230, and reference character B denotes a display device according to an exemplary embodiment of the present invention including the dummy bumps 230 and the length extension 240.

Referring to FIG. 10, the related-art display device A has a warping degree of about 4.7 μm. The display device B having the dummy bumps 230 has a warping degree of 2.2 μm. More particularly, the display device B exhibits 54% improved warpage characteristics compared to the related-art display device. The display device C having the dummy bumps 230 and the length extension 240 has a warping degree of about 1.4 μm. More particularly, the display device C exhibits 36% improved warpage characteristics compared to the display device B.

Figure 11:
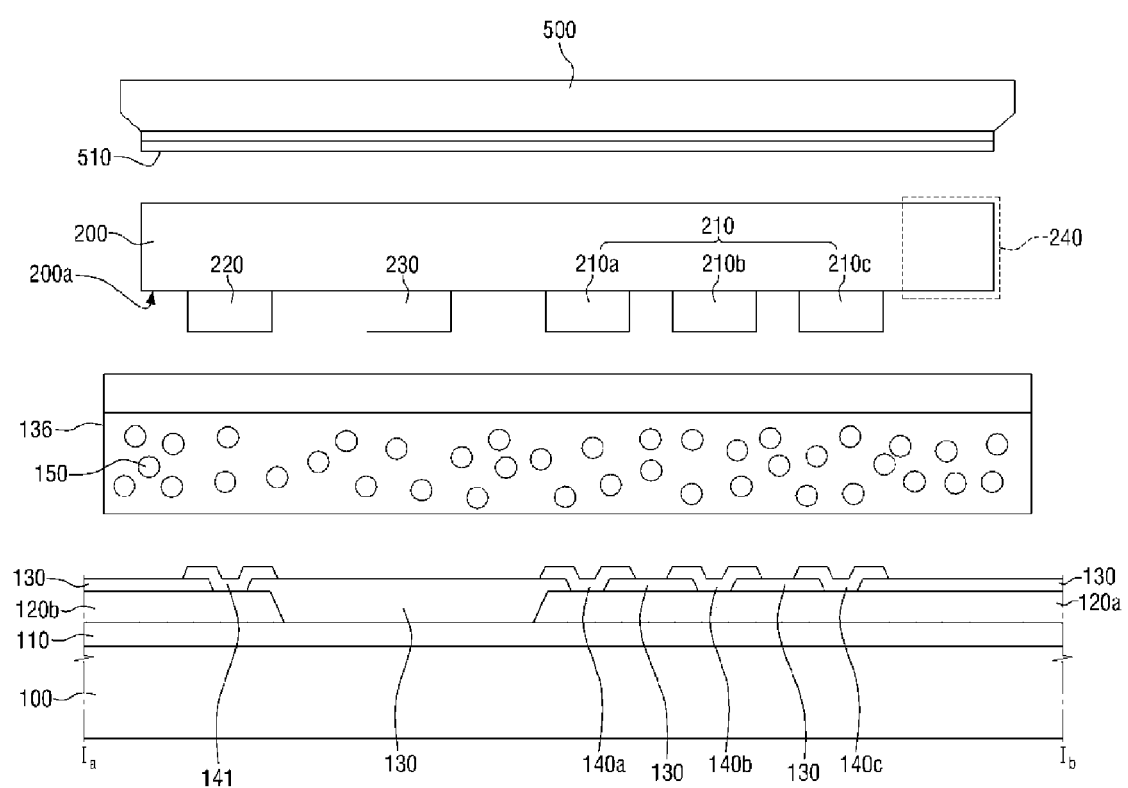
FIGS. 11 and 12 are cross-sectional views illustrating a surface mounting process in fabrication a display device according to an exemplary embodiment of the present invention.
Figure 12:
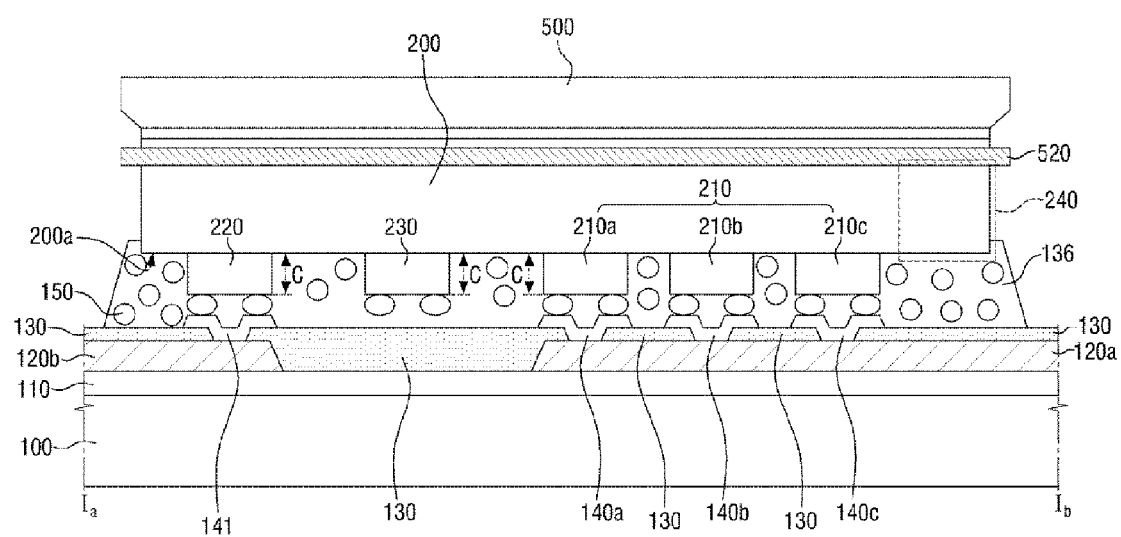

FIGS. 11 and 12 are cross-sectional views illustrating a surface mounting process performed in the fabrication of a display device according to an exemplary embodiment of the present invention. The surface mounting process will hereinafter be described with reference to a display device having dummy bumps 230 arranged in a single column on a bottom surface 200a of a driving circuit chip 200, as illustrated in FIG. 2.

Referring to FIG. 11, an anisotropic conductive film 136 may be disposed between a non-display area NA of an array substrate 100 and the driving circuit chip 200. More specifically, the driving circuit chip 200 may be arranged so that the bottom surface 200a, i.e., the mounting surface of the driving circuit chip 200 where the first bumps 210, the second bumps 220, and the dummy bumps 230 are provided, may face the non-display area NA of the array substrate 100. The driving circuit chip 200 may include a length extension 240. The length extension 240 may be substantially the same to the length extension 240 illustrated with reference to FIG. 6 and FIG. 9, and repeated description thereof will be omitted. First and second insulating layers 110 and 130, first and second pads 120a and 120b, first data electrodes 140a, 140b, and 140c, and a second data electrode 141 may be provided on the array substrate 100. The first and second insulating layers 110 and 130, the first and second pads 120a and 120b, the first data electrodes 140a, 140b, and 140c, and the second data electrode 141 may substantially be the same to the corresponding parts illustrated with reference to FIG. 6 and FIG. 9, and repeated descriptions thereof will be omitted. The first bumps 210, the second bumps 220, and the dummy bumps 230 may be formed by the same process, thereby simplifying the manufacturing process of the display device. A pressure equipment 500 may provide a predetermined temperature and pressure for an electrical circuit bonding process using the anisotropic conductive film 136. A heating tool 510 may be coupled to the bottom of the pressure equipment 500.

Referring to FIG. 12, lowering the pressure equipment 500 and the heating tool 510 may thermally compress the driving circuit chip 200 at a uniform pressure and temperature. A buffer 520 may be provided between the heating tool 510 and the anisotropic conductive film 136 to transmit heat generated by the heating tool 510 to the anisotropic conductive film 136. The dummy bumps 230 and the length extension 240 may prevent the driving circuit chip 200 from warping in the middle portion of the driving circuit chip 200 during the thermal compression of the driving circuit chip 200 by the pressure equipment 500. In addition, the length extension 240 may prevent contact failures from occurring between the first bumps 210c and the driving circuit chip 200.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:
1. A display device, comprising:
an array substrate comprising a display area and a non-display area;
a driving circuit chip disposed on the non-display area, the driving circuit chip comprising a bottom surface providing a mounting surface, a top surface facing the bottom surface, a first pair of side surfaces extending in a first direction, and a second pair of side surfaces extending in a second direction perpendicular to the first direction; and first bumps, second bumps, and dummy bumps, each of the first, second, and dummy bumps disposed on the bottom surface of the driving circuit chip in a single column along the first direction, wherein:

the dummy bumps comprise first and second dummy bump groups disposed between the first bumps and the second bumps along the first direction;

the dummy bumps in the first dummy bump group are spaced apart from each other by a first pitch; and the dummy bumps in the second dummy bump group are spaced apart from each other by a second pitch different from the first pitch.

2. The display device of claim 1, wherein a number of the dummy bumps in the second dummy bump group is less than a number of dummy bumps in the first dummy bump group.

3. The display device of claim 2, wherein the second pitch is greater than the first pitch.

4. The display device of claim 1, wherein a first distance from a first side of the dummy bumps facing the first bumps to the first bumps is substantially the same as a second distance from a second side of the dummy bumps facing the second bumps to the second bumps.

5. The display device of claim 1, wherein the width of the dummy bumps is substantially the same as the width of the first bumps and the second bumps.

6. The display device of claim 1, wherein the length of the dummy bumps is substantially the same as a length of the first bumps and the second bumps.

7. The display device of claim 1, wherein the driving circuit chip is disposed on the non-display area in a chip-on-glass (COG) structure.

8. The display device of claim 1, further comprising first pads and second pads disposed on the non-display area in columns along the first direction, wherein the first and second pads correspond to the first and second bumps, respectively.

9. The display device of claim 1, wherein:

the driving circuit chip further comprises a length extension extending along a first side of the driving circuit chip in the second direction; and the length of the length extension in the second direction is greater than the length of the first bumps.

10. A display device, comprising:

an array substrate comprising a display area and a non-display area;

a driving circuit chip disposed on the non-display area, the driving chip comprising a bottom surface providing a mounting surface, a top surface facing the bottom surface, a first pair of side surfaces extending in a first direction, and a second pair of side surfaces extending in a second direction perpendicular to the first direction;

first bumps disposed on the bottom surface of the driving circuit chip in at least two separate columns along the first direction;

second bumps disposed on the bottom surface of the driving circuit chip in a single column along the first direction, the second bumps spaced apart from the first bumps in the second direction; and dummy bumps disposed between the first and second bumps in at least two separate columns, wherein:

the dummy bumps comprise a first dummy bump group and a second dummy bump group, the first and second dummy bump groups respectively disposed on first and second sides of the driving circuit chip along the first direction, the first side being opposite to the second side;

the dummy bumps in the first dummy bump group are spaced apart from each other by a first pitch; and the dummy bumps in the second dummy bump group are spaced apart from each other by a second pitch different from the first pitch.

11. The display device of claim 10, wherein the second pitch is greater than the first pitch.

12. The display device of claim 10, wherein the dummy bumps have substantially the same shape as the first bumps and the second bumps.

13. The display device of claim 10, further comprising:

first pads disposed on the non-display area along the first direction to correspond to the first bumps; and second pads disposed on the non-display area along the first direction to correspond to the second bumps, wherein the first and second bumps are electrically connected to the first and second pads by an anisotropic conductive film, respectively.

14. The display device of claim 10, wherein:

the driving circuit chip further comprises a length extension extending along a first side of the driving circuit chip in the second direction; and the length of the length extension in the second direction is greater than the length of the first bumps.

15. A display device, comprising:

a driving circuit chip comprising a bottom surface providing a mounting surface, a top surface facing the bottom surface, a first pair of side surfaces extending in a first direction, and a second pair of side surfaces extending in a second direction perpendicular to the first direction;

an array substrate comprising a display area and a non-display area, the display area comprising an array element, the non-display area comprising first pads and second pads respectively disposed on a first side and a second side of the non-display area in a single column along the first direction, the first side being opposite to the second side;

first and second bumps disposed on first and second sides of the bottom surface of the driving circuit chip in a single column along the first direction to correspond to the first and second pads, respectively, and dummy bumps disposed between the first bumps and the second bumps in at least one column along the first direction, wherein the dummy bumps comprise a first dummy bump group comprising the dummy bumps spaced apart from each other by a first pitch, and a second dummy bump group comprising the dummy bumps spaced apart from each other by a second pitch different from the first pitch.

16. The display device of claim 15, wherein:

the driving circuit chip further comprises a length extension extending along a first side of the driving circuit chip in the second direction; and the first bumps and the second bumps are not arranged below the length extension.

17. The display device of claim 16, wherein the length of the length extension along the second direction is proportional to at least one of a number of columns of the first bumps, a distance from the first bumps to the second bumps, and compression load applied to the driving circuit chip.

18. The display device of claim 16, wherein the length of the length extension along the second direction is inversely proportional to at least one of a thickness of the driving circuit chip and a thickness of the array substrate.

19. The display device of claim 15, wherein the dummy bumps are disposed on the middle portion of the bottom surface of the driving circuit chip.

20. The display device of claim 15, wherein the dummy bumps have substantially the same thickness as the first bumps and the second bumps.

* * * * *